United States Patent [19]

Tanaka et al.

[11] Patent Number: 4,843,594

[45] Date of Patent: Jun. 27, 1989

[54] NONVOLATILE SEMICONDUCTOR MEMORY DEVICE WITH A BIAS CIRCUIT

[75] Inventors: Sumio Tanaka; Shigeru Atsumi, both of Tokyo, Japan

[73] Assignee: Kabushiki Kaisha Toshiba, Kawaski, Japan

[21] Appl. No.: 235,780

[22] Filed: Aug. 23, 1988

Related U.S. Application Data

[63] Continuation of Ser. No. 888,513, Jul. 23, 1986, abandoned.

[30] Foreign Application Priority Data

Aug. 1, 1985 [JP] Japan ................................. 60-170021

[51] Int. Cl.$^4$ ............................................. G11C 11/40
[52] U.S. Cl. ................................ 365/185; 365/189.09; 365/208
[58] Field of Search ............... 365/104, 184, 185, 189, 365/203, 205, 207, 208; 307/530

[56] References Cited

U.S. PATENT DOCUMENTS 4,223,394 9/1980 Pathak et al. ........................ 365/207
4,694,429 9/1987 Tanaka et al. ...................... 365/185

FOREIGN PATENT DOCUMENTS 0136170 4/1985 European Pat. Off. ............ 365/185
0152590 8/1984 Japan .................................. 365/205
0218696 12/1984 Japan .................................. 365/184

Primary Examiner—Terrell W. Fears
Assistant Examiner—Glenn A. Gossage
Attorney, Agent, or Firm—Finnegan, Henderson, Farabow, Garrett, Dunner

[57] ABSTRACT

A nonvolatile semiconductor memory device is disclosed comprising a bit line connected to the drain of a memory cell transistor forming a nonvolatile memory cell, a first p-channel MOS transistor, the drain and gate of the first transistor being connected to a node, and the source of the first transistor being connected to a power source potential, second and third n-channel MOS transistors connected in series between the node and a reference potential, the drain and gate of the second transistor being interconnected, and the drain and gate of the third transistor being interconnected, and a fourth n-channel MOS transistor for controlling charging of the bit line, one terminal of the drain-source path of the fourth transistor being connected to the power source potential and the other terminal being connected to the bit line, and the gate of the fourth transistor being connected to the node.

3 Claims, 5 Drawing Sheets

F I G. 3
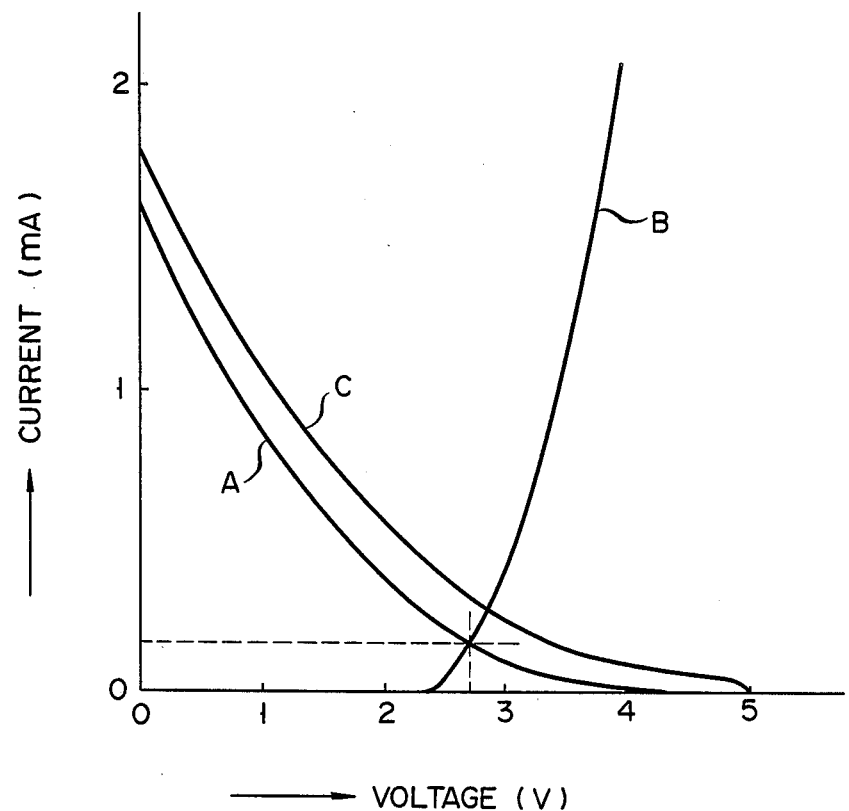

NONVOLATILE SEMICONDUCTOR MEMORY DEVICE WITH A BIAS CIRCUIT

This application is a continuation of application Ser. No. 06/888,513, filed July 23, 1986, now abandoned.

BACKGROUND OF THE INVENTION

This invention relates to a nonvolatile semiconductor memory device having a CMOS (Complementary Metal Oxide Semiconductor) circuit in a peripheral circuit and, in particular, to a nonvolatile semiconductor memory device having a bias circuit for clamping a potential on a bit line down to below a power supply potential.

A bias circuit is provided for a memory device, such as an EPROM (electronically programmable read-only memory) or an $E^2$ to clamp a power supply potential so that an excessive voltage cannot be applied to the drain of a transistor constituting a memory cell. Through the bias circuit a relatively low bias voltage is applied to the drain of the transistor in the memory to reduce a stress on the memory cell upon the reading-out of the corresponding data and thus to prevent data from being erroneously written into that memory cell.

FIG. 1 is a circuit diagram showing a conventional EPROM of a type in which data can be erased through irradiation with an ultraviolet ray. In FIG. 1, MOS transistor 11 in a memory is of such a type as to have a floating gate and control gate. Writing a "1" or "0" level data into transistor 11 is achieved by setting the threshold voltage to a predetermined level with or without the injection of electrons into the floating gate, respectively. That is, where the "1" level data is written into transistor 11, the threshold voltage is raised through the injection of electrons into the floating gate and where the "0" level data is written into transistor 11, the threshold voltage is left as it is without injecting electrons into the floating gate.

The control gate of transistor 11 is connected to corresponding word line 13, which in turn is connected to the output of the row decoder 12. Transistor 11 is connected at its drain to corresponding bit line 14, which in turn is connected to data sensing node 16 through MOS transistor 15 for column selection.

Bias circuit 40 is connected to node 16. With the device in an operative state a chip enabling signal CE becomes "0" potential level (ground potential level Vss). As a result, p-channel MOS transistor 41 is rendered conductive and n-channel MOS transistor 42 is rendered nonconductive. With the power supply voltage set to be, for example, 5 V, a voltage of about 2.5 V corresponding to the threshold voltage occurs in n-channel MOS transistor 43. A voltage drop of about 1.7 V corresponding to the threshold voltage is produced in n-channel MOS transistors 44 and 45. The threshold voltages of transistors 43, 44 and 45 are set to be, for example, 0.8 V, with their source potential at "0" volt, provided that no substrate bias is applied. Since, however, the source potential of transistor 43 becomes relatively high, that threshold voltage becomes about 2.5 V under a greater substrate bias. On the other hand, the source potential of transistor 44 or 45 becomes relatively low and thus the substrate bias becomes smaller, so that the threshold voltage comes to about 1.7 V. For this reason, transistors 43 and 44, or 43 and 45, undergo a voltage drop of about 4.2 V in total and a voltage of 0.8 V (5.0 V−4.2 V=0.8 V) at best appears on node 16.

Transistor 46 is of an n channel MOS type for permitting current to flow through transistor 43. Transistor 47 is a load element comprised of a normally ON p-channel MOS transistor. In the aforementioned memory device, a potential applied to the drain of transistor 11 is dropped through the utilization of the threshold voltage containing a substrate bias at transistors 43 and 44 as well as the threshold voltage containing the substrate bias at transistors 43 and 45. The threshold voltages of transistors 43, 44 and 45 are set to be a desired level by normally controlling an amount of boron (B) ions to be injected into the channel region of the respective transistor. For this reason, where during the manufacture the amount of ions injected has been varied owing to a variation in parameters, the transistor undergoes a greater variation in threshold voltage due to a greater substrate bias, resulting in a greater potential variation at node 16. The conventional memory device, therefore, is smaller in process margin from the standpoint of manufacture, posing an operational problem.

SUMMARY OF THE INVENTION

It is accordingly the object of this invention to provide a nonvolatile semiconductor memory device which can set a potential on a bit line to a predetermined level, under a process data fluctuation, at the time of data readout and can set a potential on the bit line to a predetermined level at high speed.

According to the invention, there is provided a nonvolatile semiconductor memory device comprising, a bit line, a memory cell transistor forming a nonvolatile memory cell, the drain of said transistor being connected to said bit line, a first MOS transistor of a first channel type, the drain and gate of said first transistor being connected to a node, and the source of said first transistor being connected to a power source potential, second and third MOS transistors of a second channel type connected in series between said node and a reference potential, the drain and gate of said second transistor being interconnected, and the drain and gate of said third transistor being interconnected, and a fourth MOS transistor of said second channel type for controlling charging of said bit line, one terminal of the drain-source path of said fourth transistor being connected to said power source potential and the other terminal being connected to said bit line, and the gate of said fourth transistor being connected to said node.

BRIEF DESCRIPTION OF THE DRAWINGS

FIG. 3 is a graph showing a voltage-current characteristic curves of EPROMs shown in FIGS. 2 and 5;

DETAILED DESCRIPTION OF THE PREFERRED EMBODIMENTS

Figure 1:
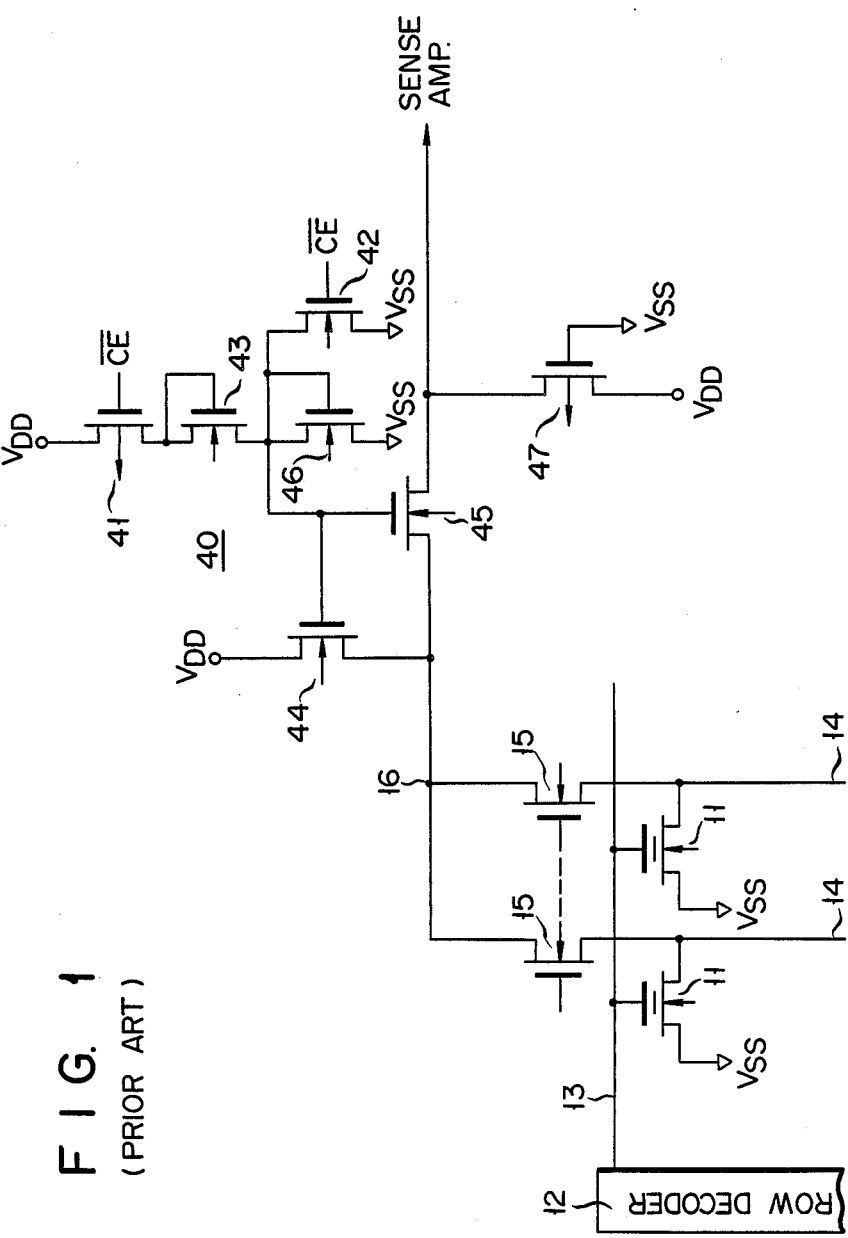
FIG. 1 is a circuit diagram showing a conventional EPROM.
Figure 2:
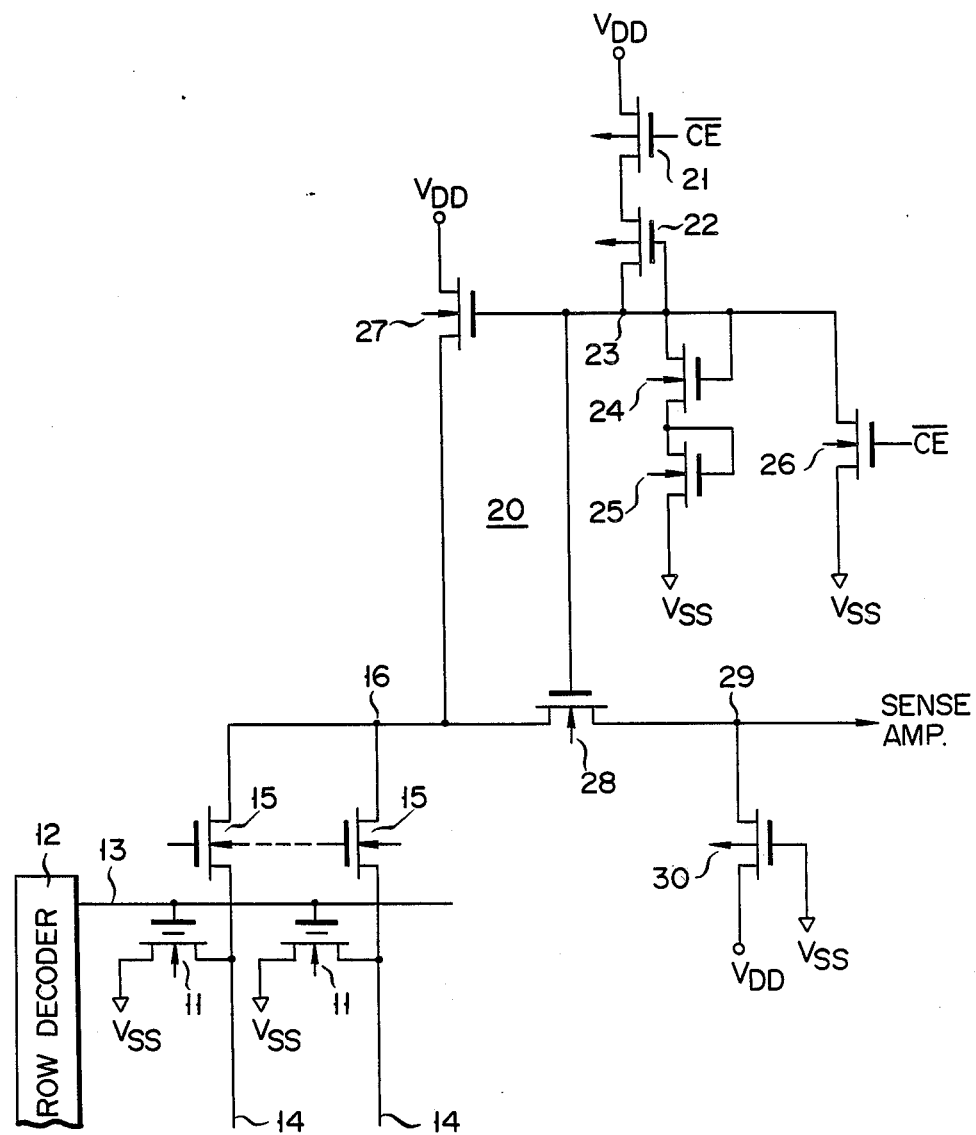
FIG. 2 is a circuit diagram showing an EPROM according to an embodiment of this invention.

FIG. 2 is a circuit diagram showing a first embodiment of this invention. The same reference numerals are employed throughout the drawings to designate parts and elements corresponding to those shown in FIG. 1.

MOS transistor 11 constituting a memory cell is of a type having a floating gate and control gate. The writing of data into transistor 11 is done by setting the threshold voltage to a predetermined level with or without the injection of electrons into the floating gate.

For example, when "1" level data is written into transistor 11 the electrons are injected into transistor 11 and when the "0" level data is written into transistor 11 no electrons are injected there. The control gate of cell transistor 11 is connected to the corresponding word line which in turn is connected to the output of row decoder 12. Transistor 11 is connected at its drain to bit line 14 which in turn is connected to data sensing node 16 through MOS transistor 15.

Bias circuit 20 is connected to node 16 and configured as set out below.

P-channel MOS transistor 21 is connected at its source to a power supply potential $V_{DD}$ and gate of transistor 21 is supplied with a chip enable signal $\overline{CE}$. This signal $\overline{CE}$ becomes a "0" level, i.e., a ground potentiometer Vss, with the device in the ON state and becomes a "1" level with the device in the wait state. The source of p-channel MOS transistor 22 is connected to the drain of transistor 21 and drain and gate of transistor 22 are both connected to node 23. The drain and gate of n-channel MOS transistor 24 are connected to node 23. The drain and gate of n-channel MOS transistor 25 are connected to the source of transistor 24. Transistor 25 is connected at its source to a ground potential Vss.

N channel MOS transistors 24 and 25 are connected to series between node 23 and ground potential $V_{SS}$. The drain and the gate of transistor 24 are interconnected, as are also the drain and gate of transistor 25. Between node 23 and the ground potential Vss is connected a source-to-drain path of n-channel MOS transistor 26 which is supplied at its gate with a chip enable signal $\overline{CE}$. The gates of n-channel MOS transistors 27 and 28 are connected to node 23. Transistor 27 is connected at its drain to the power supply potential $V_{DD}$ and at its source to node 16. The source-to-drain path of transistor 28 is connected at one end to node 16 and at the other end to input node 29. The source-to-drain path of p-channel MOS transistor 30 is connected between node 29 and power source potential $V_{DD}$ and gate of transistor 30 is connected to the ground potential Vss, noting that transistor 30 is in a normally on state and serves as a load circuit.

The operation of the device so constructed is described as follows. First with the device in the inoperative state the chip enable signal $\overline{CE}$ is at a "1" level and p-channel MOS transistor 21 is in the nonconductive state so that node 23 is not changed. When the signal $\overline{CE}$ becomes a "1" level, then n-channel MOS transistor 26 is rendered conductive and node 23 is discharged through transistor 26 to "0" level. During this period of time a voltage on node 23 becomes a ground level Vss so that n-channel MOS transistor 27 and 28 for charging data sensing node 16 are turned OFF and thus no voltage is applied to node 16.

Then the chip enable signal $\overline{CE}$ becomes a "0" level and thus p-channel MOS transistor 21 is turned ON. Since n-channel MOS transistor 26 is turned OFF due to the "0" level of the chip enable signal $\overline{CE}$, node 23 is charged through p-channel MOS transistors 21 and 22. Thus a voltage on node 23 is raised toward the $V_{DD}$ level. When it reaches a level corresponding to a sum of the threshold voltages of n-channel MOS transistors 24 and 25 in the series circuit, between node 23 and ground potential Vss, a substrate bias is applied to these transistors 24 and 25, and the node voltage is not raised any further.

In order to enhance the operation speed of the device, it is preferred that transistors 24 and 25 have a greater resultant conductance. Since, however, transistors 24 and 25 are connected in series configuration, the resultant conductance becomes smaller. It is, therefore, preferable to increase the size of transistors 24 and 25 to enhance that resultant conductance.

FIG. 3 is a characteristic curve showing a relation of a voltage on node 23 to the associated transistors in the circuit of the aforementioned embodiment. In FIG. 3, the curve A shows a current through p-channel MOS transistor 21 or 22. Since the gate of transistor 22 is connected to the drain of the transistor, it follows that, the lower the drain voltage, i.e., the voltage on node 23, the greater the current passes through transistor 22. In n-channel MOS transistors 24 and 25 in series configuration, on the other hand, the voltage on node 23 exceeds a sum of the threshold voltages of these transistors when the substrate bias is applied to the transistors, and the current through transistors 24 and 25 abruptly increase as indicated by curve B in FIG. 3. As a result, the voltage on node 23 is clamped to a level at a junction of the curves A and B and stabilized at that level. Since the n-channel MOS transistor 25 whose source is connected to the ground potential Vss undergoes no substrate bias effect, the threshold voltage of transistor 25 becomes, for example, 0.8 V as designed. In this connection it is to be noted that the threshold voltage of n-channel MOS transistor 24 becomes approximately 1.7 V, that is 0.9 V higher than the 0.8 V designated value, due to its substrate bias effect. Thus the voltage on node 23 is stabilized at 2.5 V.

For charging node 16, the threshold voltage of n-channel MOS transistors 27 and 28 undergoes the same extent of a substrate bias as in n-channel MOS transistor 24 and comes to approximately 1.7 V, which is 0.9 V higher than the designed 0.8 V. Since node 23 is connected to the gates of transistors 27 and 28, the voltage on node 16 comes to a level dropped from the voltage of node 23 by the threshold voltage of transistors 27 and 28. Since there occurs a mutual cancellation in threshold voltage between transistors 24 and 27 and between transistors 24 and 28, a voltage of 0.8 V emerges on node 16 which corresponds to the threshold voltage of transistor 25.

Since the threshold voltage of transistor 25 which undergoes no substrate bias effect appears on node 16, the displacement from the desired voltage value of the voltage on node 16 is very small, even when the amount of ions injected into the transistors during the manufacturing process varies from a predetermined amount of the ions. It is therefore possible to obtain a greater process margin than that heretofore attainable from the standpoint of the manufacture.

When the chip enables signal $\overline{CE}$ to be at a "0" level, then only a very small current is required, as a DC current is across the power source potential $V_{DD}$ and the ground potential Vss, due to the intrinsic characteristic of p-channel MOS transistor 22 under the condition that the potential on node 16 is clamped. When, however, the voltage on node 23 is raised from 0 V to 2.5 V, a heavy load current flows through p-channel MOS transistor 22 due to the intrinsic characteristic of the latter. As a result, at the time of reading out data the voltage on node 23 can be set to a predetermined level at high speed and thus to a bit line potential level at high speed.

Figure 4:
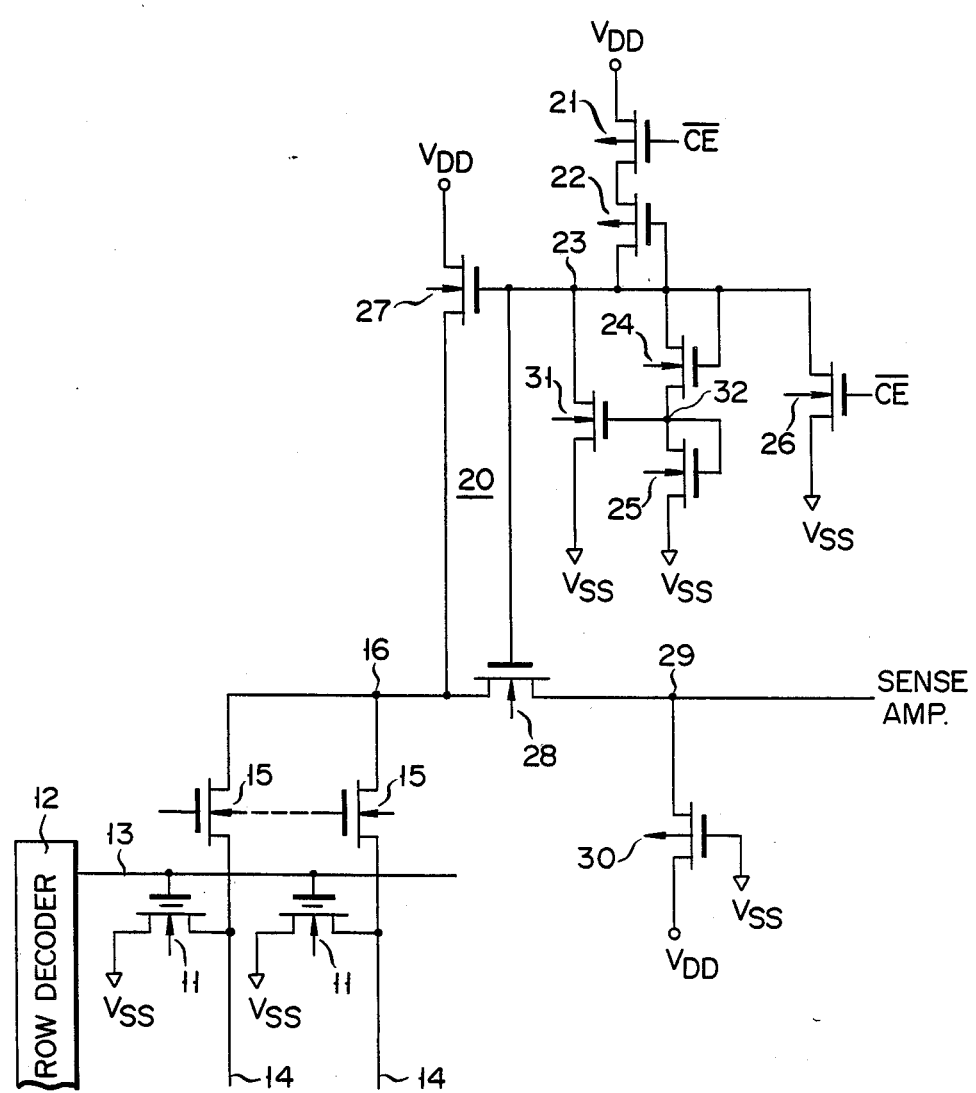
FIG. 4 is a circuit diagram showing an EPROM according to another embodiment of this invention.

FIG. 4 is a circuit diagram showing another embodiment of this invention as having been applied to an EPROM as in the case of the aforementioned embodiment. This embodiment is similar to the aforementioned embodiment except that n-channel MOS transistor 31 is connected, at its source-to-drain path, between node 23 and a ground potential Vss with its gate connected to node 32. which is connected between two n-channel MOS transistors in series configuration.

In the embodiment shown in FIG. 4, when a voltage on node 32 connected between transistors 24 and 25 reaches the threshold voltage of transistor 25, then transistor 31 is turned ON to allow an adequately large current to flow from node 23 to the ground potential Vss. When, on the other hand, a current flowing between node 23 and the ground potential Vss is constant, then an area occupied by transistors 24, 25 and 31 can be made smaller than the area occupied by transistors 24 and 25 in the embodiment of FIG. 2.

Figure 5:
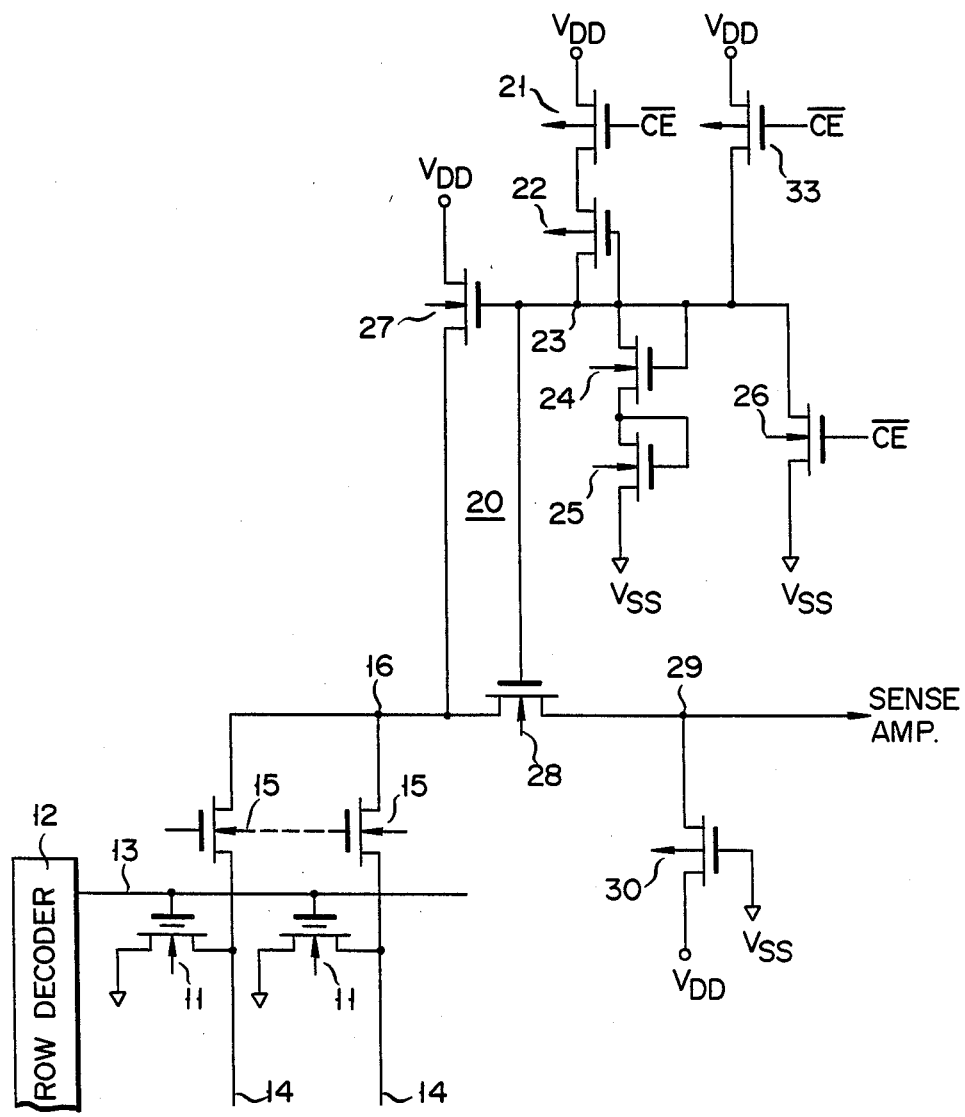
FIG. 5 is a circuit diagram showing an EPROM according to still another embodiment of this invention.

FIG. 5 is a circuit diagram showing another embodiment of this invention as being applied to an EPROM as in the case of the aforementioned embodiment.

Although in the embodiment of FIG. 2 no problems arises when $V_{DD}=5$ V, a problem occurs in relation to the threshold voltage of p-channel MOS transistor 22 when the ROM is operated at, for example, $V_{DD}=3$ V. In other words, a voltage on node 23 is raised up to the level, at most, which is obtained by subtracting the threshold voltage of transistor 22 from $V_{DD}$. When a low voltage of, for example, 3 V is used as a $V_{DD}$, then a voltage drop resulting from the threshold voltage of transistor 22 becomes too low to be disregarded.

In an embodiment shown in FIG. 5, transistor 33 is added to the circuit arrangement of FIG. 2 to compensate for the threshold voltage drop of transistor 22, to increase the margin of the power source. In other words, the source-to-drain path of p-channel MOS transistor 33 is connected between a power supply potential $V_{DD}$ and node 23 with its gate supplied with the chip enable signal $\overline{CE}$. In this connection it is to be noted that since a constant, not variable, current momentarily flows through transistor 33 a ratio W/L of the channel width W to the channel length L of transistor 33 is made adequately smaller than that of transistor 22. The presence of transistor 33 as in the embodiment shown in FIG. 5 allows the potential on node 23 to approximate to $V_{DD}$. At this time the current characteristic of the p-channel side is upwardly shifted, in a parallel fashion, as indicated by the curve C in FIG. 3 and thus a DC voltage on node 23 becomes a sum of the threshold voltage of transistors 24 and 25.

Needless to say, this invention is not restricted to the aforementioned embodiments. Changes or modifications may be made without departing from the spirit and scope of this invention. Although this invention has been explained as being applied to the EPROM, it can equally been applied to any memory device, such as an E²PROM, MNOS and EAROM, which can rewrite data, can nonvolatilely hold once-written data and can experience a stress resulting from a voltage applied to the drain of an associated transistor at the time of writing data. A power source margin can be increased at the time of a low-voltage operation by applying transistor 33, which has been added to the embodiment of FIG. 4, to the embodiment of FIG. 3. In the aforementioned embodiment, p-channel MOS transistor 30 has been used as a load circuit connected to input node 29 for sense amplifier 30. In place of this load circuit use may also been made of any proper load circuit.

According to this invention, a nonvolatile semiconductor memory device can be provided which can set a voltage on the bit line to be constant at the time of data read-out even if a process parameter varies and which can swiftly set a voltage on the bit line to be at a predetermined level when the data is read out.

What is claimed is:

1. A nonvolatile semiconductor memory device with a bias circuit for use with a data sense means comprising:
    a bit line;
    an input node for said data sense means;
    a memory cell transistor forming a nonvolatile memory cell, the drain of said transistor being connected to said bit line;
    a first MOS transistor having a channel of a first conductivity type and having a threshold voltage, the drain and gate of said first transistor being connected to a node, and the source of said first transistor being coupled to a power source potential;
    second and third MOS transistors, each having a channel of a second conductivity type and a threshold voltage, connected in series between said node and a reference potential, the drain and gate of said second transistor being interconnected, and the drain and gate of said third transistor being interconnected;
    a fourth MOS transistor, having a channel of said second conductivity type and a threshold voltage, for controlling charging of said bit line, said fourth MOS transistor having a threshold voltage substantially equal to that of said second MOS transistor, one terminal of the drain-source path of said fourth transistor being connected to said power source potential and the other terminal of the drain-source path being coupled to said bit line, and the gate of said fourth transistor being connected to said node; and
    a fifth transistor, connected between said bit line and said input node, having a channel of said second conductivity type and a threshold voltage substantially equal to that of each of said second and fourth MOS transistors, the gate of said fifth transistor being connected to said node, wherein the threshold voltage of said third MOS transistor is different from that of each of said second, fourth, and fifth MOS transistors.

2. A nonvolatile semiconductor memory device according to claim 1, further comprising a sixth MOS transistor having a channel of said first conductivity type connected between said power source potential and said node, the gate of said sixth transistor receiving a chip-enable signal.

3. A nonvolatile semiconductor memory device according to claim 1, further comprising a sixth MOS transistor having a channel of said second conductivity type, connected between said node and said reference potential in parallel to the series connection of said second and third transistors, the gate of said sixth transistor being connected to a junction of said second and third transistors.

* * * * *